(12) United States Patent
Eun et al.

(10) Patent No.: US 8,072,600 B2
(45) Date of Patent: Dec. 6, 2011

(54) INSPECTION METHOD OF CIRCUIT SUBSTRATE

(75) Inventors: Tak Eun, Gyeonggi-do (KR); Seong Jin Kim, Gyeonggi-do (KR); Dong Jun Lee, Gyeonggi-do (KR)

(73) Assignee: Microinspection, Inc., Seoul (KR)

( * ) Notice: Subject to any disclaimer, the term of this patent is extended or adjusted under 35 U.S.C. 154(b) by 211 days.

(21) Appl. No.: 12/458,183

(22) Filed: Jul. 2, 2009

(65) Prior Publication Data

US 2010/0002232 A1    Jan. 7, 2010

(30) Foreign Application Priority Data

Jul. 7, 2008    (KR) .................. 10-2008-0065748

(51) Int. Cl.
*G01B 11/00*    (2006.01)
(52) U.S. Cl. ..................................... 356/394
(58) Field of Classification Search .............. None
See application file for complete search history.

(56) References Cited

U.S. PATENT DOCUMENTS

| | | | |
|---|---|---|---|
| 4,435,091 A * | 3/1984 | Nedreski | 374/20 |
| 5,457,318 A | 10/1995 | Robinson et al. | |
| 5,460,450 A * | 10/1995 | Buck | 374/20 |
| 5,809,826 A * | 9/1998 | Baker, Jr. | 73/75 |
| 2004/0240515 A1 * | 12/2004 | Egan et al. | 374/120 |

\* cited by examiner

*Primary Examiner* — Gregory J Toatley
*Assistant Examiner* — Juan D Valentin
(74) *Attorney, Agent, or Firm* — Oliff & Berridge, PLC

(57) ABSTRACT

An inspection method for a circuit substrate is disclosed, which inspects electrical properties of a circuit substrate having a multilayered structure, by controlling inspection environments so that dew forms on a surface of the circuit substrate and detecting change of states of the dew to thereby determining variation of a thermal capacity of a conductor with respect to defective contacts or vias, micro vias and a circuit pattern of an inner layer. According to this, the inspection can be performed with respect to a wide area simultaneously and therefore the inspection productivity can be improved. In addition, since the temperature of the conductive wire can be measured directly through change of the dew, the cost for the temperature measurement can be saved. Moreover, the cost for an area sensor to sense the temperature of a wide area may be reduced while improving the inspection speed.

4 Claims, 4 Drawing Sheets

INSPECTION METHOD OF CIRCUIT SUBSTRATE

BACKGROUND OF THE INVENTION

1. Field of the Invention

The present invention relates to an inspection method for a circuit substrate, and more particularly to an inspection method for inspecting electrical properties of a circuit substrate having a multilayered structure, by controlling inspection environments so that dew forms on a surface of the circuit substrate and detecting change of states of the dew to thereby determine variation of a thermal capacity of a conductor.

2. Description of the Related Art

A multilayered circuit substrate is structured by accumulating a plurality of circuit substrates and interconnecting circuit patterns of the respective circuit substrates through contacts or vias. Compared to other general circuit substrates which include the circuit pattern on one or both sides, such a multilayered circuit substrate is capable of achieving a highly integrated circuit in a compact size.

FIG. 1 and FIG. 2 are views showing a general multilayered circuit substrate.

As shown in the drawings, the multilayered circuit substrate comprises pattern layers 20 each including circuit patterns 22, 24 and 26, and insulation layers 10 for insulation from and adhesion to the pattern layers 20, the pattern layers 20 and the insulation layers 10 which are accumulated in an alternate order.

In order to inspect whether there is any disconnection and a short circuit of the circuit patterns 22, 24 and 26 of the circuit substrate, electric currents are applied from one end of each of the circuit patterns 22, 24 and 26 one by one and voltages are measured at the other end of the circuit patterns 22, 24 and 26 as shown in FIG. 1. Otherwise, the disconnection and the short circuit may be detected by tracking a conductor using a microscope.

It is noted that the above explanation is related to the background art of the present invention, not merely to a conventional art.

Here, at least two probes are necessitated to detect the disconnection and the short circuit for one circuit pattern on the circuit substrate. Accordingly, a lot of probes are required, thereby increasing the prime cost and the inspection time.

Furthermore, in the multilayered circuit substrate, it may be impossible to detect the disconnection and the short circuit if any defect occurs at the contact or the via (section A in FIG. 3) for connecting the circuit pattern 22 disposed in an inner layer with the circuit pattern 24 disposed in an outer layer 3. Also, in case of a micro via or the inner-layer circuit pattern 22, the disconnection and the short circuit may not be detected by measuring the voltage at the outer-layer circuit pattern 24 using the probe. In addition, it may be impossible to detect the disconnection and the short circuit of the circuit pattern 26 through the microscope.

SUMMARY OF THE INVENTION

Therefore, the present invention has been made in view of the above problems, and it is an object of the present invention to provide an inspection method for a circuit substrate capable of inspecting electrical properties of the circuit substrate by controlling inspection environments so that dew forms on a surface of the circuit substrate and detecting change of states of the dew to thereby determining variation of a thermal capacity of a conductor.

In accordance with an aspect of the present invention, the above and other objects can be accomplished by the provision of an inspection method for a circuit substrate, comprising maintaining an inspection object under a first environmental condition; converting the environmental condition of the inspection object from the first environmental condition to a second environmental condition and photographing the state of dew forming on a surface of the inspection object and then disappearing; and determining the electrical properties by comparing the photographed image to an image of a reference inspection object.

The inspection object may comprise a multilayered circuit substrate.

Here, the inspection object and the reference inspection object may have the same circuit pattern as each other.

The first environmental condition may have a lower dew point than the second environmental condition.

During the photographing, a surface light source may be emitted to the inspection object by a predetermined angle.

The photographing may be performed above the inspection object.

The state of dew may include a condensation state which means whether dew is formed, a condensation degree, and a dew disappearance state.

BRIEF DESCRIPTION OF THE DRAWINGS

The above and other objects, features of the present invention will be more clearly understood from the following detailed description taken in conjunction with the accompanying drawings, in which.

DETAILED DESCRIPTION OF THE PREFERRED EMBODIMENTS

Figure 1:
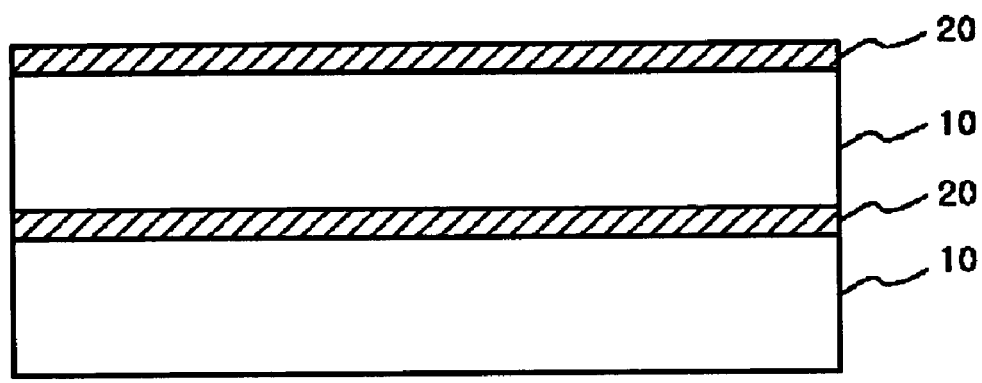
FIG. 1 and FIG. 2 are views showing a general multilayered circuit substrate.

Hereinafter, an exemplary embodiment of the present invention will be described in detail with reference to the accompanying drawings. It is noted that thickness of contours or size of respective elements of the embodiment may be exaggerated in the drawings for more convenient and clearer explanation. Also, the terms used in the following description are selected in consideration of functions of the embodiment of the invention and may therefore be varied according to the user's intention or the custom. Therefore, the terms will be defined based on the whole contents of the specification.

Figure 3:
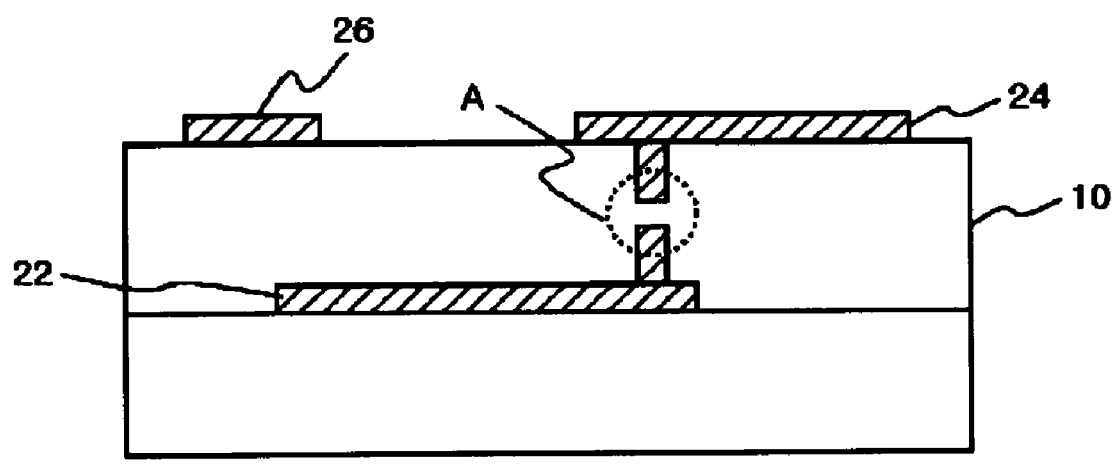
FIG. 3 is a view showing the state wherein a defect is generated in a circuit pattern disposed at an inner layer of the multilayered circuit substrate.
Figure 4:
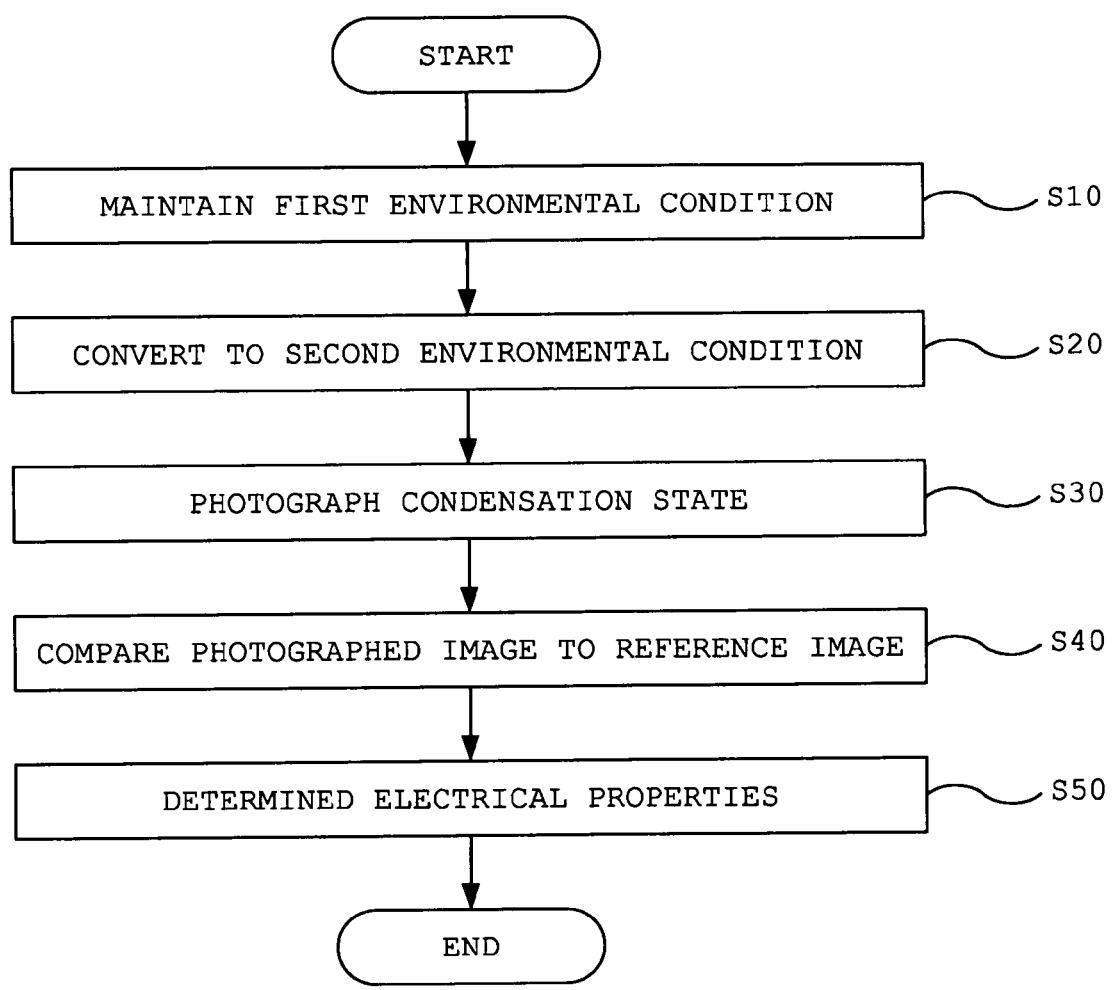
FIG. 4 is a flowchart illustrating an inspection method of the circuit substrate according to an embodiment of the present invention.

FIG. 3 is a view showing the state wherein a defect is generated in a circuit pattern disposed at an inner layer of the multilayered circuit substrate, and FIG. 4 is a flowchart illustrating an inspection method of the circuit substrate according to an embodiment of the present invention.

First, a circuit substrate which is the object of inspection is put under a first environmental condition such that heat balance is achieved between the circuit substrate and the first environmental condition (S10).

The circuit substrate maintained in the first environmental condition is converted to be in a second environmental condition (S20). The state of dew forming on a surface of the inspection object and disappearing is photographed (S30).

More specifically, when the circuit substrate that has been maintained under the first environmental condition having a lower dew point than the second environmental condition is exposed to the second environmental condition, condensation occurs, that is, dew forms at the surface of the circuit substrate which is thermally balanced to the first environmental condition.

Figure 2:
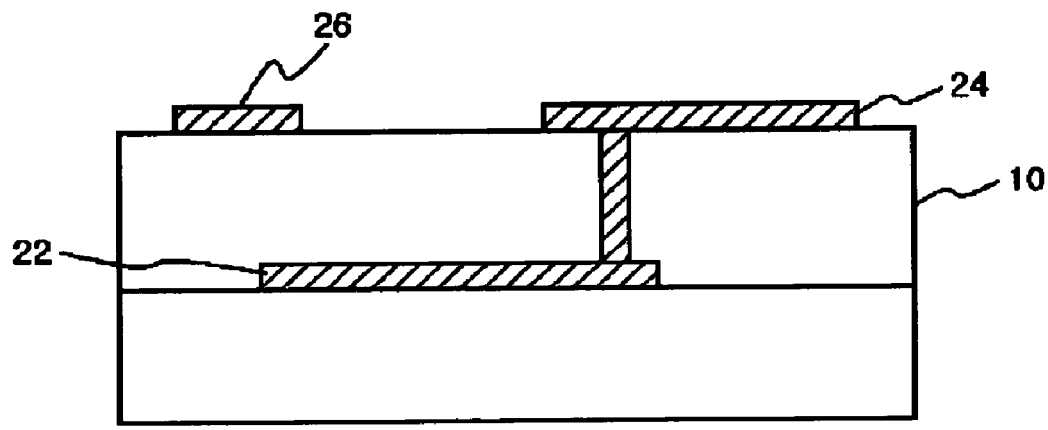

The dew formed on the surface disappears as a surface temperature of the circuit substrate increases up to a temperature of the second environmental condition. As shown in FIG. 2, in case that the dew is formed on the surface of the outer-layer circuit pattern 24 connected to the inner-layer circuit pattern 22, the dew disappears relatively slowly because the surface of the outer-layer circuit pattern 24 has a relatively greater thermal capacity than the outer-layer circuit pattern 26 being independently exposed and a surface of an outer layer having no circuit pattern thereon and accordingly heat transmission is performed from the inner-layer circuit pattern 22.

Thus, the state of dew formed on the surface of the circuit substrate, including a condensation state which means whether the dew forms, a degree of condensation and a dew disappearance state after the condensation is all photographed from above the circuit substrate. The photographed image is compared to a circuit substrate image of a reference object having the same circuit patterns as the circuit substrate of the inspection object (S40).

That is, the condensation state, the condensation degree and a dew disappearance time become all different among the outer-layer circuit pattern 24 connected to the inner-layer circuit pattern 22, the outer-layer circuit pattern 26 independently formed on the outer layer, and the insulation layer 10 formed at the outside without the circuit pattern, owing to the difference of the thermal capacity. Furthermore, since the dew disappears slowly, generation of disconnection which is one of electrical properties can be determined based on temporal change of the state of dew (S50).

Therefore, in case that the outer-layer circuit pattern 24 connected to the inner-layer circuit pattern 22 is disconnected as indicated by the section A in FIG. 3, heat transmission from the inner-layer circuit pattern 22 is not performed, and therefore the outer-layer circuit pattern 24 comes to have similar electrical properties to the independent outer-layer circuit pattern 26. Accordingly, dew formed on the disconnected outer-layer circuit pattern 24 shows different characteristics from when formed on the outer-layer circuit pattern 24 in the normal state. The electrical properties can be determined through the difference.

Also, when there is an incomplete opening such as a via hole including a micro defect, the electrical properties can be determined through variation of the heat capacity.

Thus, the electrical properties of the circuit patterns of the respective circuit substrates may be recognized by photographing the multilayered circuit substrate and comparing the photographed image to the image of the reference circuit substrate having the same circuit pattern.

Figure 5:
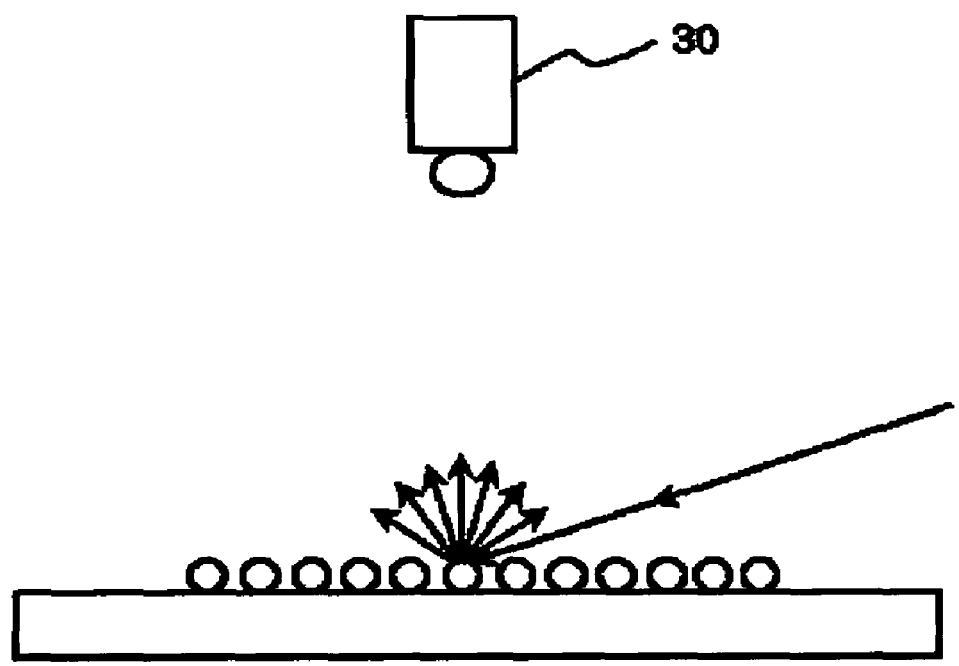
FIG. 5 is a view showing the circuit substrate being inspected by the inspection method according to the embodiment of the present invention.

Here, in case that the circuit substrate is photographed from above using a camera 30 as shown in FIG. 5, a condensation position and a non-condensation position may be clearly discriminated by emitting a surface light source to the circuit substrate by a predetermined angle since diffused reflection would occur by the dew at the condensation position. Moreover, the state of dew can be photographed more precisely.

In addition, by emitting the surface light source by the predetermined angle, overexposure of the camera 30 by the incident light being directly reflected may be prevented.

As apparent from the above description, the present invention provides an inspection method that inspects electrical properties of a circuit substrate having a multilayered structure, by controlling inspection environments so that dew forms on a surface of the circuit substrate and detecting change of states of the dew to thereby determining variation of a thermal capacity of a conductor with respect to defective contacts or vias, micro vias and a circuit pattern of an inner layer. According to this, the inspection can be performed with respect to a wide area simultaneously and therefore the inspection productivity can be improved.

In addition, since the temperature of the conductor can be measured directly through change of the state of dew, the cost for the temperature measurement can be saved.

Moreover, the cost for an area sensor to sense the temperature of a wide area may be reduced while improving the inspection speed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An inspection method for a circuit substrate, comprising:
   maintaining an inspection object under a first environmental condition such that heatbalance is achieved between the inspection object and the first environmental condition;
   converting the environmental condition of the inspection object from the first environmental condition to a second environmental condition which has a higher dew point than the first environmental condition and photographing images of the inspection object from dew forming on a surface of the inspection object to dew disappearing; and
   determining generation of disconnection within a circuit pattern of the inspection object by comparing the photographed images to images which have been obtained from a reference inspection object under the same environmental condition as the inspection object.

2. The inspection method according to claim 1, wherein the inspection object comprises a multilayered circuit substrate.

3. The inspection method according to claim 2, wherein the inspection object and the reference inspection object have the same circuit pattern as each other.

4. The inspection method according to claim 1, wherein the photographing is performed above the inspection object.

* * * * *